Oct. 6, 1964 S. RUBEN 3,152,293

SEALED SEMICONDUCTOR DEVICE AND MOUNTING MEANS THEREFOR

Filed Feb. 20, 1961 2 Sheets-Sheet 1

INVENTOR.
SAMUEL RUBEN

BY Nicholas Lang Jr.

ATTORNEY

INVENTOR.
SAMUEL RUBEN
BY Nicholas Lang Jr.
ATTORNEY

United States Patent Office 3,152,293
Patented Oct. 6, 1964

3,152,293
SEALED SEMICONDUCTOR DEVICE AND MOUNTING MEANS THEREFOR

Samuel Ruben, 52 Seacord Road, New Rochelle, N.Y.

Filed Feb. 20, 1961, Ser. No. 90,411
5 Claims. (Cl. 317—234)

This invention relates to sealed semiconductor devices, and, more particularly, to hermetically sealed p-n junction diodes or rectifiers having integrally formed mounting means incorporated therein. The present application is a continuation-in-part of my co-pending application Serial No. 76,172, filed December 16, 1960, and constitutes an improvement over the sealed semiconductor devices disclosed and claimed therein.

Conventional p-n junction diodes or rectifiers in their present commercial form generally comprise a silicon wafer having a p-n junction interposed between its top and bottom faces, The junction, which extends throughout the entire cross-sectional area of the wafer, is formed by an alloying process in which the bottom portion of an n-type silicon crystal is made p-type. This wafer, which constitutes a rectifier cell, is preferably provided on both of its faces with a thin deposit of nickel or similar metal to which a soldered connection can be readily made. The wafer thus prepared is then incorporated into various structures according to the type of practical application for which the rectifier is intended.

In a common commercial form of silicon rectifiers, which is widely used particularly for high current applications, one face of the silicon wafer is soldered to the head of a threaded mounting stud, constituting one of the electrical terminals of the rectifier and a lead wire or metal pin is soldered to the other face of the wafer, constituting the other electrical terminal of the rectifier. A flanged cylindrical metal sleeve is then secured to the head of the stud and is sealed off by an insulating material through which the terminal wire or pin extends, resulting in the so-called "top hat" type of rectifier construction. The theory underlying this construction was that, due to direct contact of one face of the semiconductor wafer with the head of the mounting stud, heat generated in the wafer would be readily conducted away into a heat sink, such as a metal support on which the rectifier was mounted by means of the threaded shank of the stud. Practical experience with this form of rectifier construction, however, does not completely confirm these expectations. In the first place, in the described construction, a short heat conducting path was at best provided between the mounting stud and one face of the silicon wafer, while the other face of the wafer was not so interposed in a heat conducting path, except for contact of a small portion of its total area with a long and thin terminal wire or pin. Furthermore, as the mounting stud had to be necessarily in direct electrical contact with one face of the silicon wafter, upon mounting the rectifier on a metal support plate or chassis, the threaded shank of the stud had to be electrically insulated from the said plate by interposition of insulating washers and bushings. As commercially available electrical insulators are poor conductors of heat, this introduced a considerable resistance in the heat conducting path between the silicon wafer and the heat sink constituted by the metal support, interfering with the intended withdrawal of heat from the rectifier. Since the maximum permissible operating temperature of silicon diodes is about 150° C., this circumstance limits the useful load which such devices can safely carry in continuous operation. Although various suggestions and proposals were made to eliminate the above difficulties experienced with conventional semiconductor diodes, none of these suggestions and proposals was completely satisfactory or successful on a practical and industrial scale.

I have discovered that the outstanding problem may be solved in a remarkably simple manner.

It is an object of the present invention to improve semiconductor devices, such as particularly semiconductor diodes or rectifiers.

It is another object of the present invention to provide a novel and improved semiconductor device hermetically sealed in a monolithic mass of encapsulating metal, which is in intimate heat exchange relation with both faces of the semiconductor wafer.

It is a further object of the invention to provide a metal-jacketed semiconductor diode in which the diode unit has a cast metal body shrunk around its entire surface and comprises a mounting member partially embedded in said body through which heat may be efficiently and conveniently withdrawn from the unit.

It is also within contemplation of the present invention to provide an improved method of manufacturing and encapsulating semiconductor devices.

The invention also contemplates a novel and improved semiconductor device, such as a diode, having integrally formed mounting means incorporated therein, which is simple in construction, possesses the advantages of moisture-proofness, insensitivity to mechanical shock and vibration, and good heat dissipation, and which may be readily manufactured on a practical and industrial scale at a low cost.

Other and further objects and advantages of the invention will become apparent from the following description taken in conjunction with the accompanying drawing, in which FIG. 1 is a vertical sectional view of a conventional semiconductor diode or rectifier now in commercial use;

Figure 1:
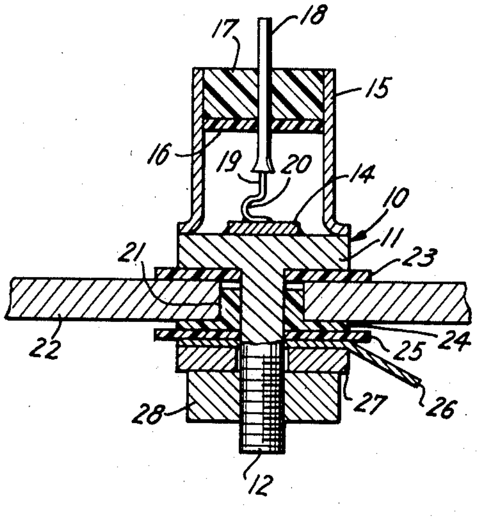

In my above-mentioned co-pending application Serial No. 76,172, I have disclosed and claimed a semiconductor device, such as a diode, comprising a silicon wafer of the p-n junction type with contacting leads or wires attached to its terminal sides, having a metal body cast therearound and electrically insulated therefrom. This is preferably accomplished by first coating the diode and a sufficient length of its terminal leads with a thin layer of heat-resistant insulation and allowing the coating to set and to harden. Thereupon the coated diode is introduced into a suitable mold and a body of molten low melting point metal is poured over it, sufficient to cover the diode unit. After the body of molten metal has cooled and solidified, the metal-encapsulated diode, with the leads extending therefrom, is removed from the mold.

I have now discovered that the operating characteristics, such as particularly the current carrying ability, of the rectifiers disclosed in my aforesaid co-pending application can be further considerably improved by incorporating a combination mounting and heat conducting member therein. In the preferred embodiment of the invention, this member is in the form of a stud made of high heat conductivity metal having an enlarged head embedded in the encapsulating metal body and a threaded shank extending therefrom whereby the rectifier can be readily secured in a mounting hole provided in a metal support or chassis. In addition to constituting a mounting means, the stud, due to its high heat conductivity, is also effective in rapidly conducting heat generated in the rectifier into the metal support.

In practicing the invention, it is preferred to start out from a rectifier junction in the form of a silicon wafer of the p-n type, which is nickel-plated on both of its faces and has a metal plate soldered to each of said faces. The bare ends of two insulated wires are respecively soldered to the said plates and constitute the electrical terminals of the rectifier. The exposed surfaces of the said wafer, of said plates and of the ends of said wires are coated with an insulating compound which, together with the insulation of the wires, provides a thin and continuous insulating layer or sheath over the entire unit. The coated preassembly is then introduced into a suitable mold in spaced relation from the walls thereof and from the head of a mounting stud. The mold is filled with molten low melting point metal which upon solidification provides an encapsulating metal shell or body from which extend the free ends of the lead wires and the threaded end of the shank of the stud, the latter being in direct contact with said metal body and in intimate heat exchange relation with both faces of the silicon wafer.

Although a great variety of insulating compounds may be used, very satisfacory results are obtained by using one comprising an intimate mixture of an epoxy resin, an inert filler, such as powdered mica or titanium oxide, and a small amount of a suitable hardener. This compound can be readily applied to the rectifier unit by dipping or brushing and, upon curing, forms a continuous, hard and abrasion-resistant insulating sheath. Titanium oxide has been found preferable as the filler for the epoxy resin because it provides good electrical insulation, high thermal conductivity, uniform suspension properties in the liquid epoxy resin and has the characteristics of completely covering and strongly adhering even to the edges of the unit or to its lead wires. Such coating or sheath, when hardened, is strong and is capable of withstanding the enclosure in a casting metal, such as a tin-lead alloy, at temperatures in the order of 200° C., or higher. The finished unit is completely encapsulated in a body of cast metal with only the insulated leads and the shank of the metal mounting stud protruding. As the alloy contracts upon solidification, it maintains the unit under very high pressure, which assures a negligible temperature gradient between the unit, the external surface of the cast body, and the shank of the mounting stud extending from said body. To obtain maximum heat dissipation, it is preferred to provide the outer surface of the cast body with corrugations or fins, such surface characteristics being readily accomplished by appropriately forming the inner surface of the mold.

In order that those skilled in the art may have a better understanding of the invention, it is considered desirable to first describe a conventional rectifier diode. Such a diode, incorporating the best present commercial practice, is illustrated in FIG. 1. Reference numeral 10 generally denotes a metal stud having an enlarged or head portion 11 with a threaded shank 12 depending therefrom. On the top surface of head 11 is soldered one face of silicon wafer 14, the lower flanged end of a metal sleeve 15 being welded or otherwise secured to the circumferential marginal regions of the said surface. At its top, metal sleeve 15 is sealed by means of a force-fitted insulating washer 16 and a body of sealing compound 17, through which extends a terminal pin 18. Electrical connection to the top surface of the silicon wafer is made by means of a thin and flexible wire 19 one end of which is soldered to the said face of said wafer and the other end of which is soldered to the lower end of contact pin 18. To accommodate thermal expansion of the silicon wafer, a loop 20 is provided in wire 19.

In mounting this conventional rectifier in an aperture 21 of a metal support plate or chassis 22, it is to be remembered that stud 10 is one of the electrical terminals of the rectifier and thus has to be insulated from the support. This is accomplished by means of a mica washer 23, a flanged Teflon (tetrafluoroethylene resin) bushing 24 and mica washer 25. The assembly is completed by a terminal lug 26, metal washer 27 and threaded nut 28, securing the rectifier to the support plate.

It will be noted that this conventional rectifier is extremely inefficient from the point of view of heat conduction. First of all, there is a small amount of heat withdrawn from the top face of the silicon wafer. Only a small portion of said face is in contact with wire 19, which at best constitutes a tenuous and inefficient heat conducting path of negligible cross section. It would be expected that heat conduction from the lower face of the silicon wafer would be better due to face to face contact of the entire surface of the wafer with the underlying head of stud 10. However, due to the necessity of insulating the stud from the mounting plate, relatively thick layers of insulating material, in the form of washers 23 and 25 and bushing 24, have to be interposed and seriously interfere with the intended efficient heat conduction. As a result a substantial heat gradient will exist between the silicon wafer and the metal support so that the rectifier has to be operated at a fraction of its potential load capacity, otherwise the silicon wafer would be overheated and ultimately destroyed.

In the following, it will be shown how the difficulties and inconveniences connected with conventional rectifiers are eliminated by the principles of the present invention.

Figure 2:
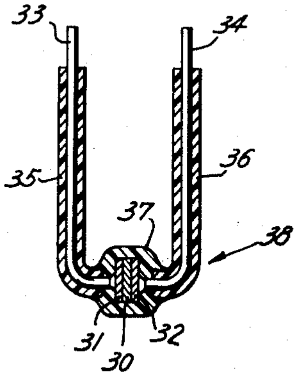
FIG. 2 is a sectional view, having parts in elevation, of a semiconductor diode or rectifier prior to its encapsulation.

Referring now to FIG. 2 of the drawing, numeral 30 denotes the rectifier junction in the form of a silicon wafer having a thin coating of nickel (not shown) on both of its faces, metal plates 31 and 32 being respectively soldered to the said faces of the wafer. Insulated copper wires 33 and 34 are soldered at their ends to metal plates 31 and 32, respectively, it being preferred to use commercially available insulated wire having a thin layer 35, 36 of a silicone resin or similar heat-resistant insulation thereon.

An insulating coating compound is prepared by milling a mixture of a liquid epoxy resin, such as one sold by Isochem Resins Co. under the name of Isochem gel, with titanium dioxide powder in the proportion of 10 grams of resin for each 6.5 grams of titanium dioxide, adding 1 gram of a hardener sold by the same manufacturer as #AS for each 16.5 grams of the mixture. The proportions of the ingredients are not critical and similar resins and hardeners of other manufacture may be used in suitable proportions with equal or similar results. The rectifier unit is dipped into the resulting liquid slurry and is withdrawn whereby wafer 30, plates 31, 32 and the bare end portions of lead wires 33 and 34 will be coated with an insulating layer. The dipped unit is first allowed to drain and is then placed in an oven heated to a temperature of about 150° C. where the coating will cure into a strong and abrasion-resistant layer denoted by numeral 37 in FIG. 2, in which the thickness of the several insulating layers has been greatly exaggerated for clarity of illustration. Insulating layer 37, together with insulation 35 and 36 of the wires, constitutes a thin and continuous insulative sheath for the entire unit. Instead of dipping, the insulative coating may be applied by other methods, such as by brushing it on.

Figure 3:
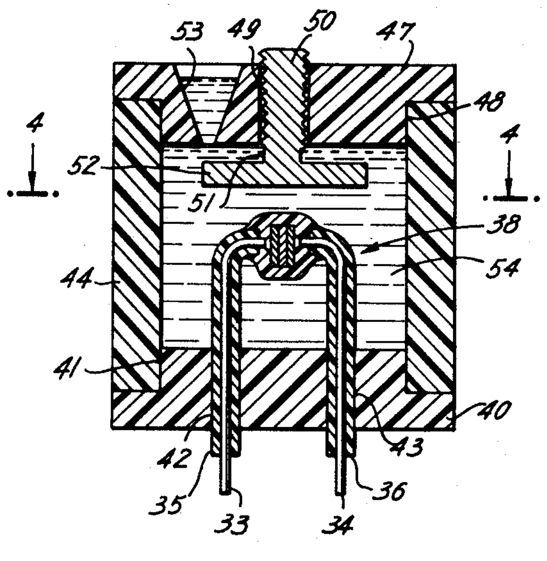
FIG. 3 is a vertical sectional view of a mold with the rectifier and its mounting means in position therein for the encapsulation treatment of the invention.
Figure 4:
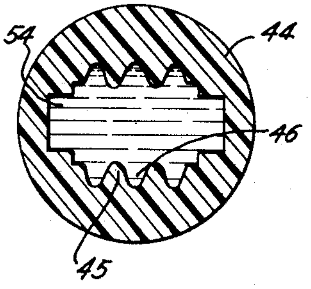
FIG. 4 is a transverse section taken on line 4—4 of FIG. 3.

The coated and insulated unit generally denoted by numeral 38, is now ready for the casting operation, which is carried out in a 3-piece mold of Teflon (tetrafluoroethylene resin) shown in FIGS. 3 and 4. The mold comprises a generally circular base 40, having a shoulder portion 41 of reduced diameter. Small apertures 42 and 43 are provided in the central region of the said base through which the terminal wires 33, 34, with insulation 35, 36 thereon, may extend with a reasonably tight fit upon the insulated unit being introduced into the mold. The intermediate portion of the mold comprises a tube or sleeve 44 of such cross section as to rest on base 40, forming a fluid-tight joint with shoulder 41 thereof. As it will be best observed in FIG. 4, sleeve 44 is provided with spaced internal ribs 45 defining axially extending spaces 46 therebetween which will manifest themselves as correspondingly shaped ribs or fins in the cast body. The upper end of sleeve 44 carries a top closure member 47 having a lower portion 48 of reduced diameter which tightly fits the said end of the sleeve. A smooth-walled aperture 49 is provided through the center of closure member 47 and has such diameter as to frictionally hold threaded shank 50 of a mounting stud 51 having an enlarged head 52 integrally formed therewith. Mounting stud 51 is preferably formed of a metal having good mechanical strength and high heat conductivity, copper being quite suitable for the purpose. A funnel-shaped aperture 53 for introduction of the molten encapsulating metal extends through closure member 47 and has its lower end greatly constricted for reasons which will appear as the description proceeds.

In carrying out the casting operation, a quantity of low melting point alloy 54 is melted and is poured into the mold through funnel-shaped opening 53 so as to completely fill the entire inner space of the mold around rectifier unit 38 and around head 52 of the mounting stud and also the major portion of the funnel which will constitute a hydrostatic head assuring a sound casting. In most cases, it is desirable to provide a small groove or channel (not shown) in the joint between mold parts 44 and 47 through which the air originally present in the mold may escape. A short period thereafter the molten metal will cool and solidify and the metal-encapsulated rectifier unit may be withdrawn from the mold. This may be accomplished by lifting top closure member 47 and breaking off the portion of the cast metal filling funnel 53 at its constricted lower end whereupon the encapsulated unit will readily slide out of sleeve portion 44 of the mold. Removal of the finished unit is greatly facilitated by the smooth and non-adhering surface characteristics of the mold, all three parts of which are made of Teflon.

Various low melting point alloys may be used, such as alloys containing tin and lead in various proportions according to the desired melting point. A specific alloy which I found particularly suitable for the purposes of the invention consists of 63% by weight of tin and 37% by weight of lead and has a pouring point of about 200° C. This alloy, when molten, will flow quite readily and has relatively high heat conductivity upon solidification. Other suitable alloys are those of cadmium and tin, although these alloys are not quite as desirable as the above-mentioned tin-lead alloy due to their lower thermal conductivity and to their tendency to flow less readily. The melting point of the casting alloy may be considerably higher than the maximum permissible operating temperature of the silicon wafer itself, since the cast body of molten metal will cool with great rapidity and will solidify long before the wafer would be adversely affected by excessive temperatures.

Figure 5:
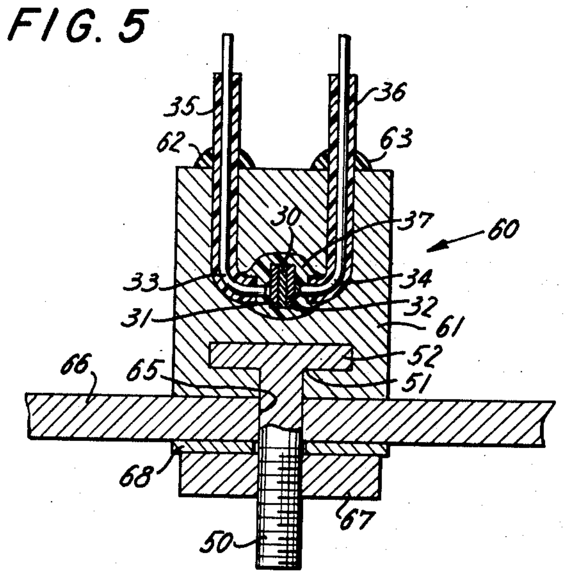
FIG. 5 is a vertical sectional view of a completed semiconductor diode or rectifier embodying the present invention, mounted on a supporting base.
Figure 6:
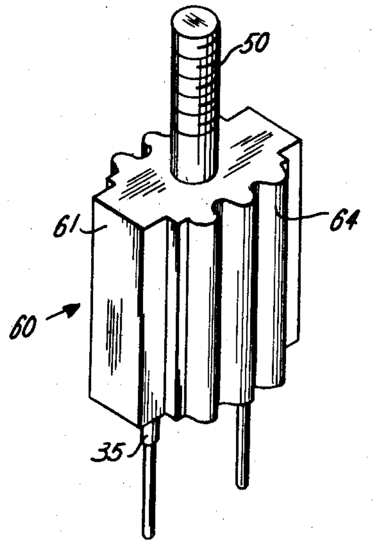
FIG. 6 is a perspective view of the rectifier shown in FIG. 5.

FIG. 5 illustrates in section the completed metal-encapsulated rectifier unit of the invention generally denoted by numeral 60. It comprises the semiconductor rectifier having a thin and hard layer of insulation 37 thereon, which together with thin layers of insulation 35 and 36 on wires 33 and 34, respectively, constitutes a thin and continuous insulating sheath of good heat transmission characteristics. An integral cast metal body 61 is shrunk around the sheathed rectifier from which body extend lead wires 33, 34 at one end and threaded shank 50 of copper mounting stud 51 at the other end. To provide mechanical reinforcement for insulated wires 33 and 34, a small amount of epoxy resin may be provided around their insulating layers 35 and 36, respectively, where the wires emerge from the cast metal body, such reinforcement being indicated by numerals 62 and 63. As it will be best observed in FIG. 6, which is a perspective view of the completed, metal-encapsulated rectifier, cast metal body 61 is provided with axially extending integral fins 64 on its circumferential surface, which increase the area that is available for heat radiation. The radiation of heat may be further promoted by providing the cast metal body with a thin black coating, for example by applying to its surface an aqueous suspension of graphite sold under the name Aquadag.

Since the electrical terminals of the rectifier, wires 33 and 34, are insulated from cast metal body 61, mounting the rectifier on a support is extremely simple. As it will be seen in FIG. 5, all that is needed is to provide an aperture 65 in a metal support or chassis represented by plate 66, through which threaded shank 50 of stud 51 may extend. The said stud is then readily secured to plate 66 by means of nut 67 and interposed metal washer 68.

The efficiency of the described construction and mounting from the point of view of heat transmission and dissipation is immediately apparent. Both faces of silicon wafer 30 are in intimate heat exchange relation with cast metal body 61 through the thin insulative sheath constituted by insulating layer 37 and insulation 35, 36 of the lead wires, such heat exchange being further promoted by metal plates 31, 32, the length of wires 33, 34 and due to the fact that cast metal body 61 contracts upon solidification and exerts substantial pressure on the rectifier unit. Thus, only a very small temperature gradient will exist between the silicon wafer 30 and the cast metal body 61, which, due to its relatively large heat capacity and finned construction, will quickly dissipate the heat generated in the silicon wafer. Also, cast body 61 is in intimate heat exchange relation with metal supporting plate 66, constituting a heat sink, partly through the large area of direct contact between the two and partly through copper stud 51 of high heat conductivity. The said stud provides an additional heat conducting path between the metal-encapsulated rectifier and its supporting plate due to its substantial cross section, high specific heat conductivity, and due to the absence of any interposed electrical and heat insulating layers characteristic of conventional structures.

Figure 7:
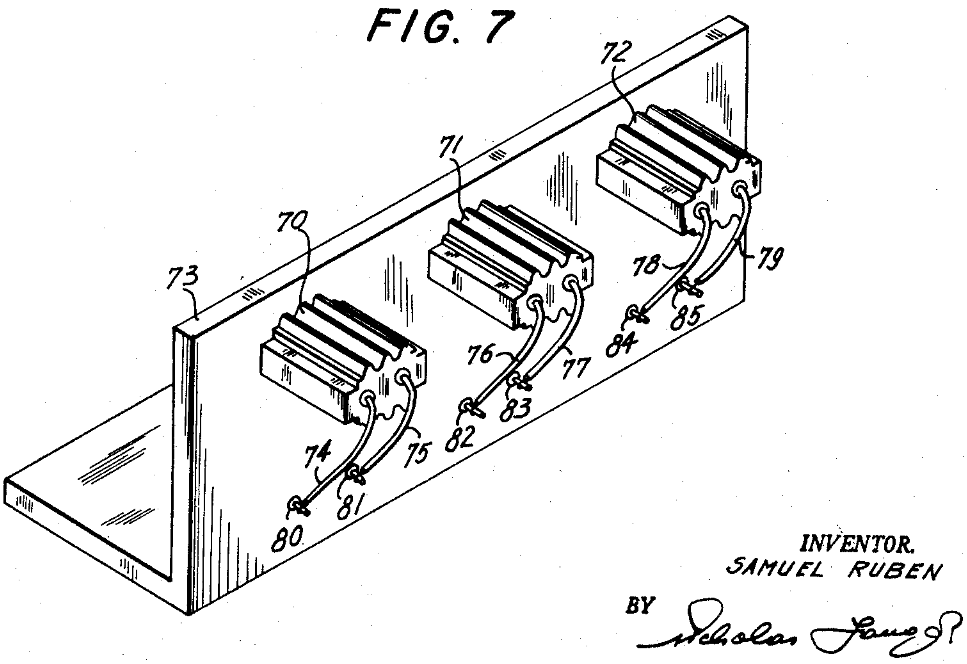
FIG. 7 is a perspective view of a plurality of rectifiers embodying the invention mounted on a common metal support plate constituting a heat sink therefor.

The metal-encapsulated rectifiers of the invention having integrally formed mounting means incorporated therein are particularly suitable for applications where a plurality of rectifiers is required in a single circuit. Examples of such applications are single-phase full-wave, three-phase half-waves and three-phase full-wave rectifier circuits, respectively comprising 2, 3 and 6 rectifiers. Of these, three-phase full-wave rectifier circuits have recently acquired considerable commercial importance due to the possible replacement of the usual direct current generators with three-phase alternating current generators in automotive equipment. As in the rectifiers of the invention the electrical terminals in the form of flexible lead wires are insulated, mounting a plurality of rectifiers on a single metal chassis or support becomes extremely simple since no insulating washers or bushings are required and at the same time the heat transmission to the common heat sink is very efficient. Such an assembly is shown in FIG. 7 and comprises 3 rectifiers 70, 71 and 72 mounted by their studs (not shown) to a common metal plate 73. Lead wires 74, 75, 76, 77, 78 and 79 of the rectifiers are connected to terminal posts 80, 81, 82, 83, 84 and 85, respectively, which are insulatedly mounted on the plate 73 and can be readily connected with any other components to provide the desired rectifier circuit.

It will be noted that the metal-encapsulated, stud-mounted rectifier of the invention provides a number of important advantages. Thus, the cast metal mass maintains the rectifier unit, including the relatively fragile silicon wafer, under compression and protects it from mechanical damage due to vibration, or thermal and mechanical shock. The metal encapsulation provides a positively moisture-proof seal which is not adversely affected by cyclic temperature changes encountered in use. The cast metal body is in intimate heat exchange relation with the entire rectifier, including both faces of the silicon wafer, so that at all times only a low temperature gradient can exist between the rectifier junction and the external heat dissipating and radiating surfaces. Also, the said metal body provides an efficient heat sink of such thermal capacity as to assure adequate heat absorption from the rectifier and radiation to the external atmosphere even under the most adverse operating conditions. As both electrical terminals of the rectifying junction are insulated from the encapsulating metal body, the rectifier unit can be directly mounted on a metal support or chassis by its integrally connected stud, providing not only a mechanical fastening element but also a heat conducting path of low resistance, which is unobstructed by any interposed layers of insulation. Finally, the principles of the invention can be readily applied to conventional silicon rectifying junctions on a quantity production scale at a low cost.

Although the present invention has been disclosed in connection with preferred embodiments thereof and as applied to silicon rectifiers, variations and modifications may be resorted to by those skilled in the art without departing from the principles of the invention. Thus, the invention is applicable with equal or similar results to germanium diodes, silicon or germanium transistors, tunnel diodes and other semiconductor devices, as those skilled in the art will readily understand. All of these variations and modifications are considered to be within the true spirit and scope of the present invention, as disclosed in the foregoing description and defined by the appended claims.

What is claimed is:

1. A sealed semiconductor unit comprising a semiconductor wafer, a metal plate secured to each face of said wafer, a pair of electrically insulated terminal wires having one of their ends respectively connected to said plates, a layer of heat conductive electrical insulation covering said wafer and said plates and together with the insulation of said wires constituting a thin and continuous insulative sheath for and in contact with said unit, a monolithic encapsulation of fused low melting point metal shrunk around and in contact with said sheath with the other ends of said wires extending therefrom, said encapsulation providing mechanical reinforcement and a moisture-proof seal for said wafer and constituting a heat sink in intimate heat exchange relation with both faces of said wafer but being electrically insulated therefrom, and a mounting stud of high heat conductivity metal having a head embedded in said encapsulation and spaced from said wafer and a shank extending from said head through said encapsulation for securing the unit to a support and to conduct away heat from both faces of said semiconductor wafer through the encapsulation to such support while said wafer remains electrically insulated from said support.

2. The sealed semiconductor unit according to claim 1, wherein at least a portion of the insulative sheath is composed of a synthetic resin and an inert filler.

3. The sealed semiconductor unit according to claim 1, wherein at least a portion of the insulative sheath is composed of titanium dioxide dispersed in a cured thermo-setting resin.

4. The sealed semiconductor unit according to claim 1, wherein the mounting stud is formed of copper and the encapsulation of low melting point metal is formed of a lead-tin alloy.

5. The sealed semiconductor unit according to claim 1, wherein the metal encapsulation is formed with integral fins to provide an increased area for heat dissipation.

References Cited in the file of this patent

UNITED STATES PATENTS

| | | |
|---|---|---|
| 2,752,541 | Losco | June 26, 1956 |
| 2,903,629 | Walker | Sept. 8, 1959 |
| 2,981,873 | Eannarino et al. | Apr. 25, 1961 |

FOREIGN PATENTS

| | | |
|---|---|---|
| 1,039,136 | Germany | Sept. 18, 1958 |
| 1,041,600 | Germany | Oct. 23, 1958 |